United States Patent [19]

Jordan et al.

[11] 4,446,504

[45] May 1, 1984

[54] MOUNTING MEANS WITH SOLDERABLE STUDS

[75] Inventors: William D. Jordan; Howard G. Hinshaw, both of Dallas; Donald L. Clemens, The Colony, all of Tex.

[73] Assignee: Thermalloy Incorporated, Dallas, Tex.

[21] Appl. No.: 532,085

[22] Filed: Sep. 13, 1983

Related U.S. Application Data

[63] Continuation of Ser. No. 271,600, Jun. 8, 1981, abandoned.

[51] Int. Cl.³ ............................................... H05K 7/20
[52] U.S. Cl. ...................................... 361/386; 357/81; 339/17 C
[58] Field of Search ................... 174/16 HS; 361/386, 361/387, 388, 400, 403; 357/81, 82; 339/17 C, 17 CF, 112 R

[56] References Cited

U.S. PATENT DOCUMENTS

| | | | |
|---|---|---|---|
| 3,248,471 | 4/1966 | Danchuk | 174/16 HS |
| 3,396,361 | 8/1968 | Sussman | 174/16 HS |
| 3,487,350 | 12/1969 | Hammell | 339/17 C |
| 3,495,131 | 2/1970 | Melcher | 361/386 |
| 3,859,570 | 1/1975 | Veranth | 361/386 |
| 4,321,423 | 3/1982 | Johnson | 361/386 |

Primary Examiner—G. P. Tolin
Attorney, Agent, or Firm—Richards, Harris & Medlock

[57] ABSTRACT

Disclosed is means for mounting semiconductor device cases on mounting substrates such as circuit boards. The mounting means includes studs passing transversely through the body of the mounting means for mounting a semiconductor case or semiconductor case and heat sink on one side of the body. The opposite ends of the studs are coated with a solder-promoting material so that the studs may be soldered directly to the circuit board. The body may include electrically conductive pin receptacles for mating with pins extending from the semiconductor case. The pin receptacles have solderable shanks extending from the opposite side of the socket body. Stand-off bosses are also disclosed for spacing the mounting body from the surface of the circuit board and for spacing the heat sink from the surface of the mounting body.

9 Claims, 3 Drawing Figures

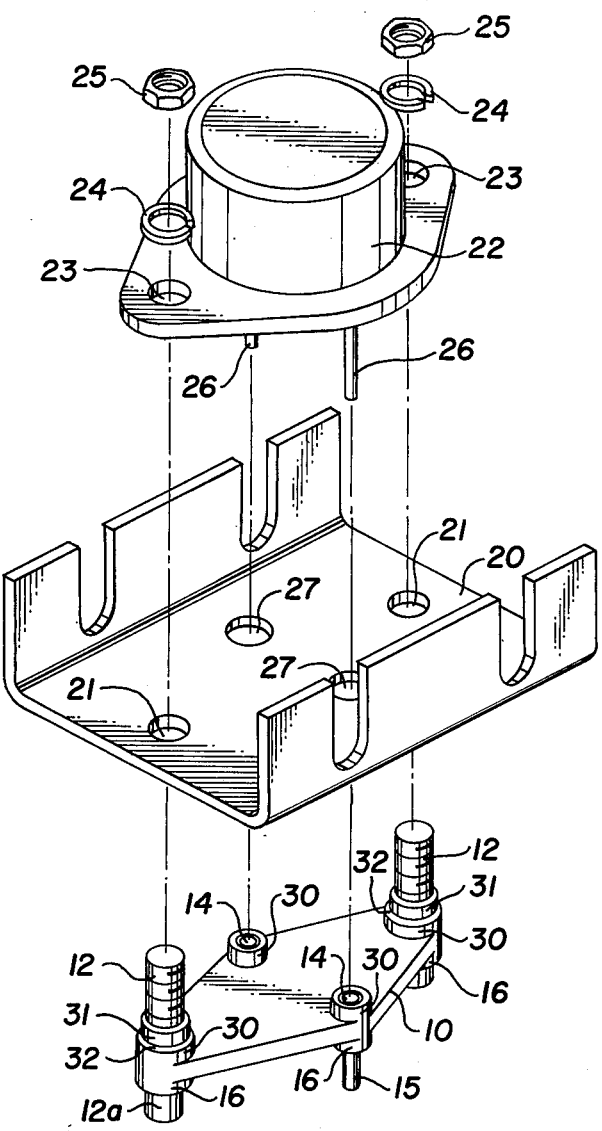
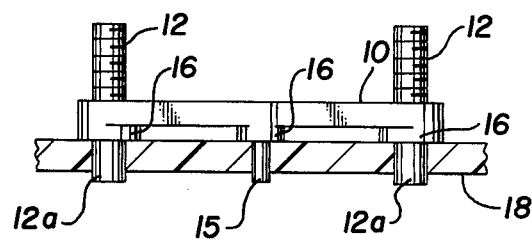

MOUNTING MEANS WITH SOLDERABLE STUDS

This application is a continuation of application Ser. No. 271,600, filed June 8, 1981, now abandoned.

This invention relates to apparatus for assembly of circuit components on mounting substrates such as circuit boards and the like. More particularly, it relates to apparatus for assembly and mounting of semiconductor device packages and heat sinks for such semiconductor device packages and the like on printed circuit boards or other mounting substrates.

Many semiconductor devices generate heat during operation which must be dissipated to avoid damage to the device. In some devices the heat generated is dissipated sufficiently by the enclosure, header or leads. Other devices may be mounted on heat sinks comprising bodies of thermally conductive materials such as copper, aluminum or the like which dissipate the heat generated by the devices into the surrounding environment. Such heat sinks may be extruded or sheet metal bodies including heat dissipating fins or the like.

In many applications it is customary to mount a heat sink between the semiconductor header or case and the substrate on which the case is mounted, such as a circuit board or the like, so that the case and heat sink may be held in intimate broad-area contact to aid in conduction of thermal energy from the case to the heat sink and so that the case may be electrically connected to the mounting substrate by soldering or other means, if desired. Conventionally, a circuit employing a plurality of components, some of which require heat sinks, is pre-assembled with the individual components which do not require heat sinks positioned on a circuit board. Thereafter, the components are attached to the circuit board by conventional wave soldering of the leads to the circuit pads. After cleaning and trimming, the circuit board is inspected and the semiconductor devices which require heat sinks are hand mounted with loose hardware such as bolts or the like which pass through the circuit board. The leads from each heat sink mounted component must be hand soldered to the circuit board, the mounting hardware installed, and the cleaning, trimming and inspection steps repeated. However, in some applications it is preferable that the heat sink mounted semiconductor case be secured to the circuit board by less permanent means than soldering so that the semiconductor device may be conveniently removed for inspection, testing and/or replacement without breaking solder connections. Accordingly, it is highly desirable that socket means be provided for mounting such devices, which socket means may be attached to the mounting substrate by soldering in the same soldering operation in which the other devices are attached to the circuit board. In this manner, all solder connections, including those for connecting the other components to the circuit board as well as those attaching the socket to the circuit board, may be formed in a single operation. Thereafter, the removable devices may be plugged into the sockets and secured thereto by suitable fastening means.

In mounting some devices on a circuit board, a heat sink may or may not be required even though the encapsulation package is designed to accommodate a heat sink. Furthermore, some packages need not be mounted in sockets but may have their leads soldered directly to the circuit board while still requiring the package to be otherwise physically or electrically connected to the board. For example, the standard TO-220 package comprises a plastic package with leads extending from one end thereof and a heat transfer plate forming one side of the package parallel to the plane of the leads. The heat transfer plate extends past the end of the plastic body opposite the leads and has an opening therein for mounting the package on a mounting stud or for attaching the package to a heat sink or the like. Conventionally, such devices are positioned on the board with their leads bent to mate with eyelets in the board and the heat transfer plate must also be bolted to the circuit board using conventional loose hardware such as nuts and bolts. The invention also provides mounting means for such devices which eliminates the need for extra handling and loose hardware.

In accordance with one embodiment of the present invention, a mounting socket is provided which includes solderable mounting studs and pin connector shanks which may be attached to the circuit board by soldering. Preferably, the socket is attached to the circuit board in the same soldering operation in which the other components are attached to the board. Thereafter, semiconductor components and the like can be plugged into the sockets as required to form the desired circuits, but the devices may be removed therefrom as desired without breaking any soldered connections. Furthermore, the semiconductor devices may be mounted in the sockets with or without heat sinks, as desired, using conventional heat sinks and conventional hardware for attaching the semiconductor case to the heat sink and socket. Accordingly, all the circuit components which are soldered to the circuit board as well as the sockets for additional devices may be pre-assembled on a circuit board or the like and soldered to the circuit board in a single soldering operation. However, the additional steps of hand mounting and soldering, etc., of heat sink mounted components is eliminated. Instead, additional components may be plugged into the pre-mounted sockets with or without heat sinks and attached directly to the socket, resulting in a substantial time saving and reliability improvement.

In accordance with another embodiment of the invention, a solderable mounting support is provided which is similar in many respects to the mounting socket. However, the mounting support need not have pin receptacles therein. Instead, the mounting support comprises an insulating base with stand-off bosses and a solderable stud extending therethrough. The semiconductor device may be mounted on the base with or without a heat sink and secured to the stud. The entire assembly may then be placed on the circuit board with the stud base and the leads positioned in appropriate holes in the board and the assembly mechanically and electrically attached to the circuit board in the same wave soldering operation used to attach the other components to the board.

The novel mounting socket of the invention comprises a substantially flat socket base formed of substantially electrically insulating material. Mounting studs passing through the base and secured thereto extend in opposite directions from the major faces of the base. One end of the stud is provided with means for securing a semiconductor case thereon, such as screw threads or the like. The other end is covered with solder or solder-promoting material. Electrically conductive pin receptacles are also mounted in the socket base to receive the pins projecting from the semiconductor case. The pin receptacles include solderable shanks extending from the opposite side of the socket base. Thus the socket may be positioned on a circuit board or the like with the solderable ends of the studs and the solderable shanks of the pin receptacles positioned in appropriate mounting holes or eyelets in the board. Other circuit components may also be mounted on the circuit board in conventional manner with the leads extending through holes or eyelets in the board. Thereafter, all the components on the board, including the sockets, are soldered to the board in conventional manner, thus securing the sockets to the board and soldering the shanks of the pin receptacles to appropriate circuit paths on the board. The additional components may then be simply plugged into the sockets and secured thereto with conventional nuts or the like on the ends of the studs extending from the top face of the socket. Similarly, where pin receptacles are not included in the mounting body, the package is first secured to the stud on the mounting body and the stud and leads soldered to the board simultaneously with the other components. Accordingly, the conventional subsequent steps of mounting heat sinks or other devices with loose hardware, hand soldering and subsequent cleaning, trimming and inspection are totally eliminated. Pre-mounting of the socket or pre-assembly of the device with mounting means in accordance with the invention thus results in vast time savings in circuit board assembly operations, eliminates tedious hand assembly of circuit boards with loose hardware, and eliminates hand soldering. Furthermore, the semiconductor device may be removed from the sockets as desired without breaking any soldered connections. Thus not only is a vast saving in assembly time realized, but reliability of solder connections and uniformity of the soldering assembly process is vastly improved. Additionally, inspection, testing and replacement of defective components is facilitated.

Other features and advantages of the invention will become more readily understood from the following detailed description taken in connection with the appended claims and attached drawings in which:

FIG. 1 is an exploded view of an assembly for mounting a semiconductor component and heat sink employing one embodiment of the socket of the invention;

FIG. 2 is an elevational view of another embodiment of the novel mounting socket of the invention illustrating the assembly thereof on a circuit board shown in section.

Figure 3:
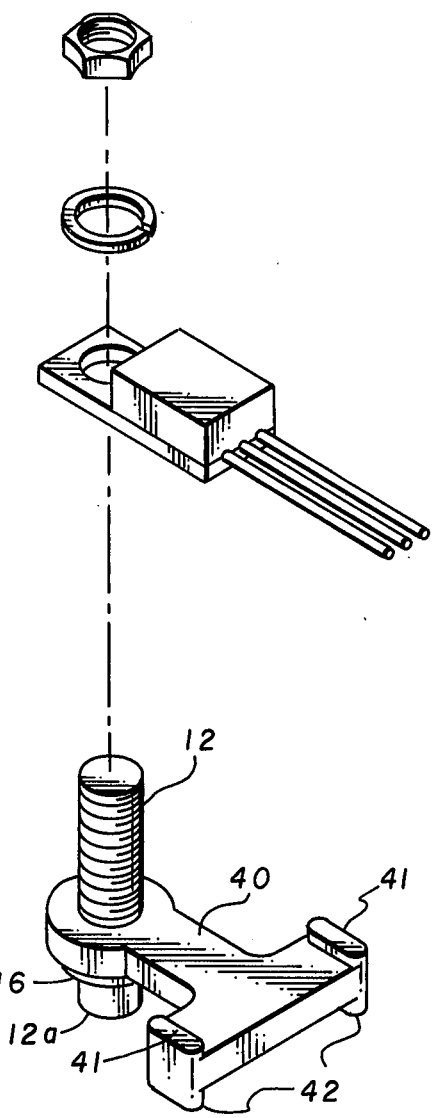
FIG. 3 is an exploded view of an assembly for mounting a semiconductor component with or without a heat sink employing another embodiment of the invention.

Assembly of a semiconductor device case and heat sink on a circuit board or the like employing the socket embodiment of the invention is illustrated in FIGS. 1 and 2. While the invention is described herein with particular reference to assembly of a semiconductor device encapsulated in a standard TO-3 type header and employs a single broad-base heat sink, it will be readily apparent that the principles of the invention are equally applicable to assembly of circuits employing various other encapsulation cases and may be used without or with heat sinks of various design.

As illustrated in FIG. 2, a conventional printed circuit board 18 (shown only in portion) is employed for mounting and electrically interconnecting a plurality of discrete semiconductor components to form a circuit. Conventionally, the printed circuit board 18 is a non-conductive material having a conductive pattern (not shown) printed on the underside thereof. In the conventional assembly operation, semiconductor devices are positioned on the top surface of circuit board 18 with their leads extending through holes in the board and the leads electrically connected to the printed conductive circuit on the underside of the board by wave soldering methods. The design, fabrication and assembly of circuit boards and circuit components is well known to those skilled in the art and therefore will not be described in detail herein.

For convenience and clarity of illustration, the invention is described herein with particular reference to conventional printed circuit boards. It will be readily apparent, however, that the invention is not so limited. Instead, the principles of invention are equally applicable to mounting sockets or supports on any mounting substrate to which components may be attached by soldering. Accordingly, it is to be understood that the term "circuit board" as used herein is meant to describe any substrate for mounting components to which such components may be attached by soldering.

As illustrated in the drawings, the preferred embodiment of the socket of the invention comprises a substantially flat base body 10 formed from a substantially electrically insulating material such as phenolic or other suitable plastic. The base body 10 thus has a first major face (top surface) and a second major face (bottom surface) on opposite sides thereof. The size and shape of the base body 10 may vary, of course, depending upon the size and configuration of the semiconductor case in connection with which it is to be used. Mounting studs 12 extend transversely through the base body 10 and are secured therein. The ends of studs 12 extend substantially perpendicularly from the top and bottom major faces, respectively, of the base body 10. The upper ends of the studs are provided with means, such as screw threads or the like, for mounting a semiconductor case or the like thereon. The opposite ends 12a of the studs are coated with a solder-promoting material as described hereinafter.

The base body 10 also carries a plurality of electrically conductive pin receptacles 14 mounted within apertures in the base body 10. The pin receptacles 14 include shanks 15 extending from the opposite side of the base body 10 substantially parallel with the solderable ends 12a of the mounting studs 12. Preferably, the shanks 15 are also coated with solder-promoting material.

The base body 10 is preferably formed of an electrically non-conductive material to provide mutual electrical isolation between the pin receptacles 14 and between the studs 12 and the pin receptacles 14. The pin receptacles 14 may be formed of any suitable conductive material such as aluminum, aluminum alloys and the like. Similarly, the studs 12 may be formed of any suitable solderable material which is sufficiently sturdy to provide mechanical attachment of the socket to the board and retain the semiconductor case on the socket.

The base body 10 may be formed by any suitable means, such as by casting, injection molding and the like. Furthermore, the mounting studs 12 as well as the pin receptacles 14 may be integrally formed therein during such molding or casting or may be mounted within apertures formed in the base body 10 after the base body has been formed.

As illustrated in FIGS. 1 and 2, the base body 10 may include stand-off bosses 16 extending from the lower face thereof to space the main body of the base body 10 from the surface of the mounting substrate. The stand-off bosses 16 thus provide an open space between the socket body and the mounting substrate to facilitate cleaning under the socket base after assembly of the circuit board. The bosses 16 may surround the studs 12 and/or the shanks 15 (as illustrated in the drawings) or may be otherwise positioned on the lower face of the base body 10 as described.

As illustrated in FIG. 2, the socket of the invention is attached to a mounting substrate, such as circuit board 18, by inserting the solderable ends 12a of the studs and shanks 15 into suitable holes or eyelets in circuit board 18. The socket may then be soldered to the circuit board in the same soldering operation as used to solder the leads of other circuit components to the same circuit board. Accordingly, the sockets and other components are simultaneously attached to the circuit board in a single conventional wave soldering operation.

In order to assure satisfactory mechanical and electrical connection between the circuit pattern (not illustrated) on the underside of the circuit board and the shanks 15 as well as to provide uniform mechanical interconnection between the ends 12a of the studs and the circuit board, the shanks 15 and ends 12a of the studs are preferably pre-tinned or otherwise coated with a solder-promoting material. Thus, when the sockets are positioned on the circuit board along with the other components, all the components, including the sockets, may be securely joined to the board and electrically interconnected with appropriate circuit paths on the board in a single soldering operation. Since the studs 12 extend through the socket base body 10, the semiconductor case and/or heat sink may be secured thereto and electrically connected to or isolated from appropriate circuit paths on the board as desired. The solderable studs, therefore, may provide both mechanical and electrical connections.

It is, of course, preferred that the stud ends 12a and shanks 15 be pre-tinned to assure uniform and secure soldered connections. While the invention is described herein in terms of components coated with solder-promoting materials, it will be understood by those skilled in the art that the term "solder-promoting material" as used herein includes terms such as "tin-plated", "pre-tinned" and the like which are used herein in the broadest sense to include coatings of conventional solder and solder-aiding or solder-promoting compositions such as tin, tin-lead alloys, fluxes and the like, regardless of the actual composition of the coating or the method by which it is applied. It is only important that the studs are securely mechanically bound by soldering and that the shanks 15 are uniformly electrically connected with the appropriate circuit paths during the conventional soldering operation.

Since the lower ends 12a of studs 12 are securely fastened to the circuit board and shanks 15 are likewise soldered to circuit paths on the circuit board, the socket base 10 is rigidly attached to the top surface of the circuit board. Accordingly, additional components may be attached to the socket as desired. For example, as illustrated in FIG. 1 a conventional heat sink 20 with apertures 21 in the base thereof may be positioned with the studs 12 passing through apertures 21. A semiconductor encapsulation case 22 with mounting apertures 23 in the base thereof is positioned on the heat sink 20 with studs 12 passing through apertures 21 in the heat sink and apertures 23 in the device case 22. The assembly is rigidly secured together by conventional means such as lock washers 24 and nuts 25 mating with the threads on studs 12. Conductive pins 26 extending from the lower face of the semiconductor device case 22 pass through apertures 27 in the heat sink 20 and are received in electrically conductive pin receptacles 14. It will be observed that the heat sink and semiconductor device case are rigidly mechanically secured to the socket with the semiconductor device case in intimate broad-area contact with the heat sink 20. Furthermore, since the pins 26 are positioned within electrically conductive pin receptacles 14, the semiconductor device is not permanently secured to the circuit board 18. Instead, the device 22 may be removed for testing, inspection and/or replacement by removing the nuts 25 and withdrawing the pins 26 from receptacles 14. Thus no soldered connections need be broken to remove the device 22 from the circuit.

In the embodiment illustrated in FIG. 1, stand-off bosses 30 surround the studs 12 and electrically conductive pin receptacles 14 near the top surface of the base body 10. In this manner, the heat sink 20 is spaced from the socket body to permit circulation of air thereunder. Where a heat sink is not employed, the bosses 30 on the top surface may be eliminated as illustrated in FIG. 2 and the semiconductor device mounted directly adjacent the top surface of the socket body 10.

It will be readily recognized that the top bosses 30 need not necessarily surround the studs 12 but may be placed at any other position suitable to provide spacing between the heat sink and the surface of the socket. Furthermore, where the bosses 30 are intended only to provide spacing between the heat sink 20 and the surface of the socket body, the bosses 30 surrounding the studs 12 need only have an external dimension greater than the diameter of the aperture 21 in the heat sink 20 in the plane normal to the axis of the stud 12. Where electrical isolation between the heat sink 20 and the studs 12 is desired, the bosses 30 may be provided with a portion 31 of reduced diameter at the top ends thereof. The bosses 30 will then have a shoulder 32 on which the heat sink is supported while top ends 31 project through the apertures 21. Accordingly, an electrically insulating but thermally conducting shield (not shown) may be placed between the case 22 and the heat sink 20 to provide complete electrical isolation between the case 22 and the heat sink 20. Similarly, the top ends 31 may be also adapted to project through apertures 23 in the mounting base of the semiconductor case 22. Insulating washers or the like may then be used to electrically isolate the case 22 from the studs 12. Various other arrangements will be readily apparent to those skilled in the art.

It will be further recognized that when employing the socket of the invention, the socket alone may be soldered to the circuit board along with the other circuit components or, if preferred, the heat sink and/or semiconductor device may be first assembled on the socket and the socket subassembly thereafter soldered to the circuit board in the attachment soldering operation. Since the pre-assembled socket and semiconductor case (or socket, case and heat sink) is to be attached to the circuit board by soldering, the pre-assembled unit may be treated in exactly the same manner as other circuit components. The other components are simply positioned with their leads extending through appropriate holes in the board and the pre-assembled unit positioned with the tin-plated ends 12a of the studs extending through the holes conventionally provided for attaching heat sink mounted devices. Since the end 12a of the stud 12 is pre-tinned, the pre-assembled unit is soldered to the circuit board in the same soldering operation used to solder the leads of the other components. Therefore, the conventional post-assembly and hand soldering operations are totally eliminated.

It should be noted that although the socket is attached to the circuit board when the stud ends 12a are soldered, the nuts 25 are on the top surface. Accordingly, the case 22 may be removed for replacement without removing the socket or the heat sink. Therefore, servicing and maintainence of circuit boards using the mounting socket of the invention are quite convenient.

As illustrated in FIG. 3, the mounting base need not include electrically conductive pin receptacles. Instead, the base body may be adapted to support a semiconductor encapsulation package in a position spaced from the circuit board while providing means for rigidly securing the package, with or without a heat sink, to the board. In the embodiment of FIG. 3, the base body 40 comprises a substantially flat body of substantially electrically insulating material as described hereinabove. A stud 12 is mounted to extend transversely therethrough. The end 12a on the lower side of the body is coated with a solder-promoting material as described hereinabove and the opposite end is provided with threads or other means to attach a semiconductor device package thereto.

The embodiment shown in FIG. 3 is designed to accommodate a standard TO-220 package and, if desired, may have upstanding bosses 41 on the top surface thereof to position the device on the mounting body. The body 40 also has bosses 16 and 42 extending from the lower face thereof to space the body 40 from the surface of the circuit board.

It will be apparent that any semiconductor package, such as the TO-220 package shown or other semiconductor packages, may be assembled on the circuit body 40 with or without a heat sink and attached to the circuit board by soldering the solderable end 12a of the stud and the leads simultaneously with other circuit components.

Not only does the assembly process of the invention result in a major time saving, elimination of hand soldering operations, but it also improves reliability of the completed circuit boards. Any hand soldering operation conducted after partial assembly of the circuit board may result in accidental damage to the previously soldered connections. Furthermore, manual handling of partially assembled boards to attach heat sinks or additional components thereto with conventional loose hardware also increases the risk of accidental damage. By soldering all the components in a single operation, the risks of post-soldering hand operations are totally eliminated.

In the embodiments illustrated, the studs 12 are of substantially uniform diameter with screw threads on the top ends thereof. It will be recognized, however, that the pre-tinned ends 12a may be of any suitable dimensions to fit standard or specially designed mounting holes in the circuit board. Similarly, the top ends of the studs need not be provided with standard threads. Obviously, other means for securing the semiconductor case to the stud 12, such as swage clasps or the like, may be employed instead of the threaded connections shown. The mid-sections of the studs may be designed with ribs, flanges or the like as required to maintain the studs securely embedded in the plastic base, depending upon the manner in which the studs are secured within the base body.

If desired, the entire stud 12 and pin receptacle may be pre-tinned prior to assembly of the socket. Alternatively, only the shanks 15 and ends 12a of the studs may be pre-tinned prior to or after assembly of the mounting body. Various suitable conventional methods for forming solder-promoting coatings on the stud ends 12a are available and well-known to those skilled in the art.

While the invention has been described with particular reference to specific embodiments thereof, it is to be understood that the forms of the invention shown and described in detail are to be taken as preferred embodiments thereof, and that various changes and modifications may be resorted to without departing from the spirit and scope of the invention as defined by the appended claims.

What is claimed:

1. A device mounting a semiconductor package to a circuit board, the package having conductive pins extending from the package, the mounting device comprising:
   a body formed of electrically insulating material having top and bottom surfaces;
   said body including apertures receiving the conductive pins to provide electrical insulation between the pins and to allow the pins to be electrically connected to the circuit board; and
   stud means having first and second ends mounting the semiconductor package to said body and mounting said body to the printed circuit board, such that the package is electrically connected to the circuit board, said stud means being carried by and secured to said body and extending through said body substantially transversely to said top and bottom surfaces, such that said first end of said stud means extends substantially perpendicularly from said top surface of said body and receives the semiconductor package and said second end of said stud means extends substantially perpendicularly from said bottom surface of said body and is electrically connected to the circuit board, such that said body insulates the semiconductor package from the circuit board while providing selective electrical connection between the circuit board and the semiconductor package through said stud means.

2. The mounting device of claim 1 wherein said stud means further includes:
   means for securing the semiconductor package to said first end of said stud means.

3. The mounting device of claim 2 wherein said securing means includes thread means.

4. The mounting device of claim 1 wherein said stud means further includes:
   solder-promoting material covering at least a portion of said second end of said stud means.

5. The mounting device of claim 1 and further including:
   spacing means extending from said top surface of said body for spacing said body from the semiconductor package.

6. The mounting device of claim 5 wherein said spacing means includes means for electrically isolating said stud from said semiconductor package.

7. The mounting device of claim 6 wherein said isolating means includes boss means surrounding a portion of said first end of said stud means adjacent said body top surface and having a first dimension in the plane normal to the axis of said stud means adjacent to the top surface of said body and a second dimension less than said first dimension in the plane normal to the axis of said first end of said stud means removed from said body, thereby defining a shoulder on said boss means spaced from said top surface of said body.

8. The mounting device of claim 1 and further including:

spacing means extending from said bottom surface of said body for spacing said body from the circuit board.

9. The mounting device of claim 1 and further including:

receptacle means disposed in said body apertures for receiving the conductive pins of the semiconductor package.

* * * * *